United States Patent [19]
Ando et al.

[11] Patent Number: 5,285,096
[45] Date of Patent: Feb. 8, 1994

[54] HIGH STABILITY STATIC MEMORY DEVICE HAVING METAL-OXIDE SEMICONDUCTOR FIELD-EFFECT TRANSISTORS

[75] Inventors: Manabu Ando; Hiroshi Furuta, both of Tokyo, Japan

[73] Assignee: NEC Corporation, Tokyo, Japan

[21] Appl. No.: 944,117

[22] Filed: Sep. 11, 1992

[30] Foreign Application Priority Data

Sep. 13, 1991 [JP] Japan ................... 3-262842

[51] Int. Cl.$^5$ ..................... H01L 27/02; H01L 27/10; H01L 27/15
[52] U.S. Cl. ..................... 257/379; 257/344; 257/365; 257/380; 257/391; 257/392; 257/401; 257/408; 257/904
[58] Field of Search ............. 257/903, 904, 344, 365, 257/379, 380, 390, 391, 392, 401, 408

[56] References Cited

U.S. PATENT DOCUMENTS

| | | | |
|---|---|---|---|
| 4,866,002 | 9/1989 | Shizukuishi et al. | 257/392 |
| 4,890,144 | 12/1989 | Teng et al. | 257/903 |
| 5,122,846 | 6/1992 | Haken | 257/903 |

OTHER PUBLICATIONS

"Static-Noise Margin Analysis of MOS SRAM Cells", by E. Seevinck, IEEE Journal of Solid State Circuits, vol. SC-22, No. 5, Oct. 1987, pp. 748-754.

*Primary Examiner*—Ngan Ngo
*Attorney, Agent, or Firm*—Burns, Doane, Swecker & Mathis

[57] ABSTRACT

A static memory device has memory cells each having a pair of driver MOSFETs, two load resistors each connected between a power source and a drain of each of the driver MOSFETs, two access MOSFETs each of which is connected between the drain of each of the driver MOSFETs and each of bit lines and gates of which are connected to a word line. In the memory cell, the thickness of a gate oxide film of the access MOSFET is made thicker than that of the gate oxide film of the driver MOSFET. The operation stability of the memory cell is enhanced, without the need of increasing a chip size, by increasing a ratio between the driver MOSFETs and the access MOSFETs of the memory cell (the ratio of current supplying capabilities of the two transistors) without making a gate size large or without making it so small as to cause process variations.

4 Claims, 9 Drawing Sheets

ACCESS MOSFET

HIGH STABILITY STATIC MEMORY DEVICE HAVING METAL-OXIDE SEMICONDUCTOR FIELD-EFFECT TRANSISTORS

BACKGROUND OF THE INVENTION (1) Field of the Invention

The present invention relates to a static memory device, and more particularly to a high stability static memory device having metal-oxide-semiconductor field-effect transistors (hereinafter referred to as "MOSFETs").

(2) Description of the Related Art

Generally, how a flip-flop is designed for static memory device determines good or bad of a product it is The most important concern in designing a flip-flop relates to the stability of the memory. The IEEE Journal of Solid-State Circuits, Vol. Sc-22, No. 5, October, 1987, discusses the stability of a memory cell by comparing a static memory cell in which the flip-flop is formed by CMOS inverters and a static memory cell in which the flip-flop is constituted by inverters with resistor loads. As discussed therein, the most effective and assured way for enhancing such stability is to increase the so-called "cell ratio".

Herein the relation between the cell ratio and the stability of the cell is explained with reference to the drawings.

Figure 1:
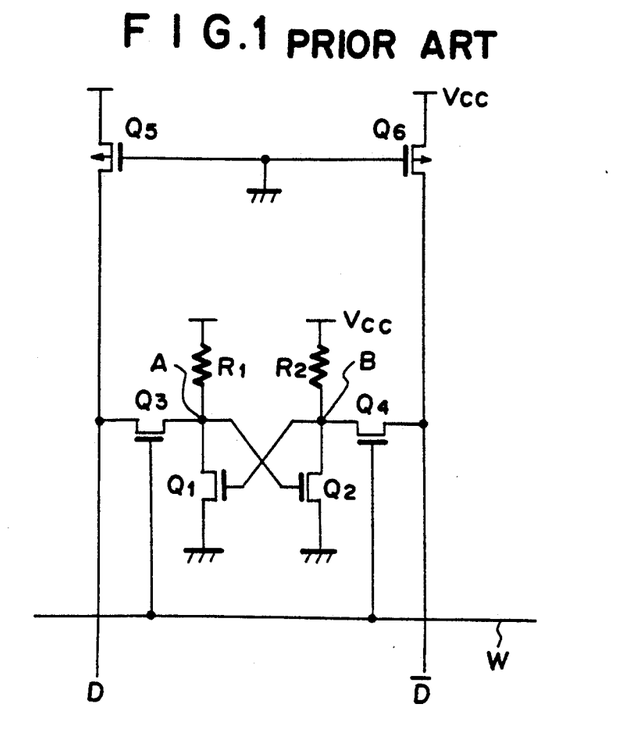
FIG. 1 is a typical circuit diagram of a static memory cell.

FIG. 1 shows a bit line load circuit and a memory cell circuit for a typical static memory device. In the drawings, D, $\overline{D}$ denote a pair of bit lines; W denotes a word line; Q1, Q2 denote driver MOSFETs of inverters constituting a flip-flop of the memory; Q3, Q4 denote access MOSFETs for connecting the memory cell with the bit lines D, $\overline{D}$; R1 and R2 denote load resistors of the inverters of the flip-flop for the memory; and Q5, Q6 denote load MOSFETs of the bit lines D, $\overline{D}$. Here, it is assumed that the MOSFETs constituting the memory cell are all N-channel MOSFETs and the load MOSFETs of the bit lines are both P-channel MOSFETs.

The operation of the above circuit is briefly explained hereunder.

When data are written to the memory cell, the data to be written are sent to the bit lines from a write circuit (omitted in FIG. 1) and one of the bit lines is raised to a $V_{CC}$ level and the other becomes approximately a GND level. For example, when the opposite level data are to be written to the memory cell in which a node A is a high level (hereinafter referred to as "H-level") and a node B is a low level (hereinafter referred to as "L-level"), the word line W is caused to be in a selecting state (the $V_{CC}$ level) with the bit line D being approximately at GND level and the bit line $\overline{D}$ being at the $V_{CC}$ level. Then, the level of the node A which is H-level will be discharged through the access MOSFET Q3 so that the level of the node A will be turned to the L-level. Consequently, the driver MOSFET Q2 will be OFF, and the H-level of the bit line $\overline{D}$ enters into the node B through the other access MOSFET Q4. In this manner, the opposite level data with respect to the initial data can be written in the memory cell.

Immediately after the writing of the data, the H-level of the memory cell is at a voltage lower than the $V_{CC}$ by a threshold voltage $V_T$ of the access MOSFET. When the writing is completed, the word line W becomes the L-level and the memory cell is then in a holding state. Under this state, both the access MOSFETs Q3 and Q4 are OFF, the driver MOSFET Q1 is ON and the driver MOSFET Q2 is OFF. Each of the load resistors R1 and R2 of the cell used has a high resistance value of above 100 GΩ so that the L-level of the memory cell becomes approximately the GND level. On the other hand, although the H-level of the memory cell is at a voltage lower than the $V_{CC}$ by the threshold voltage $V_T$ of the access MOSFET immediately after the writing of the data as already explained, there develops a gradual charging through the cell load resistor, so that the H-level of the memory cell eventually reaches the $V_{CC}$ level. Thus, in the data holding state in which once a sufficient time has passed after the data writing, the L- and H-levels of the cell are the GND level and the $V_{CC}$ level, respectively.

Next, the read-out operation is explained. In the read out operation, the word line is selected normally in a state in which the bit lines have been precharged. That is, before the word line becomes the H-level, the potential of the bit lines D, $\overline{D}$ has already raised to the $V_{CC}$ level. Therefore, when the level of the word line gradually rises, first the access MOSFET connected to the node at the L-level side of the memory cell becomes ON and, thus, the potential of the L-level of the memory cell starts to rise. However, under the normal state, this level is lowered by the driver MOSFET in an ON-state, followed by the lowering of the level of the word line in a precharged state down to the neighborhood of the GND level. On the other hand, the bit line at the node of the H-level side remains at a precharged state without being discharged to the L-level. That is, the data held by the memory cell has been thus read-out to the bit lines.

In performing the data read-out operation, an important factor for determining the stability of the memory cell is the degree as to how high the L-level at the L-level side node rises. If the L-level exceeds a threshold voltage of the driver MOSFET, the H-level of the memory cell abruptly drops from the $V_{CC}$ level to a voltage lower by the threshold voltage of the access MOSFET than the voltage of the word line. This results in the reduction of a potential difference between the H-level and the L-level of the memory cell and, in an actual memory cell, there is a risk in which the H-level and the L-level of the memory cell is reversed. In order to prevent the levels of the memory cell from being reversed, it is necessary to limit the rising of the L-level of the memory cell (which means that the rising of the L-level of the memory cell be limited so as not to exceed the threshold voltage of the driver MOSFET).

Next, how the L-level of the memory cell results is explained with reference to FIGS. 2 and 3.

Figure 2:
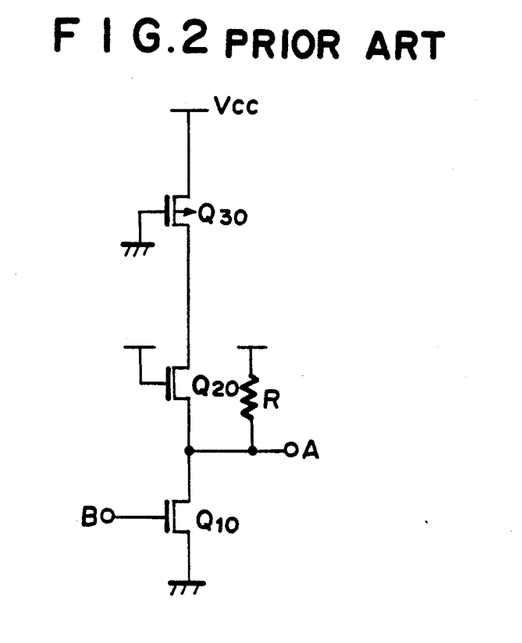
FIG. 2 is an equivalent circuit diagram of a portion of the circuit shown in FIG. 1.
Figure 3:
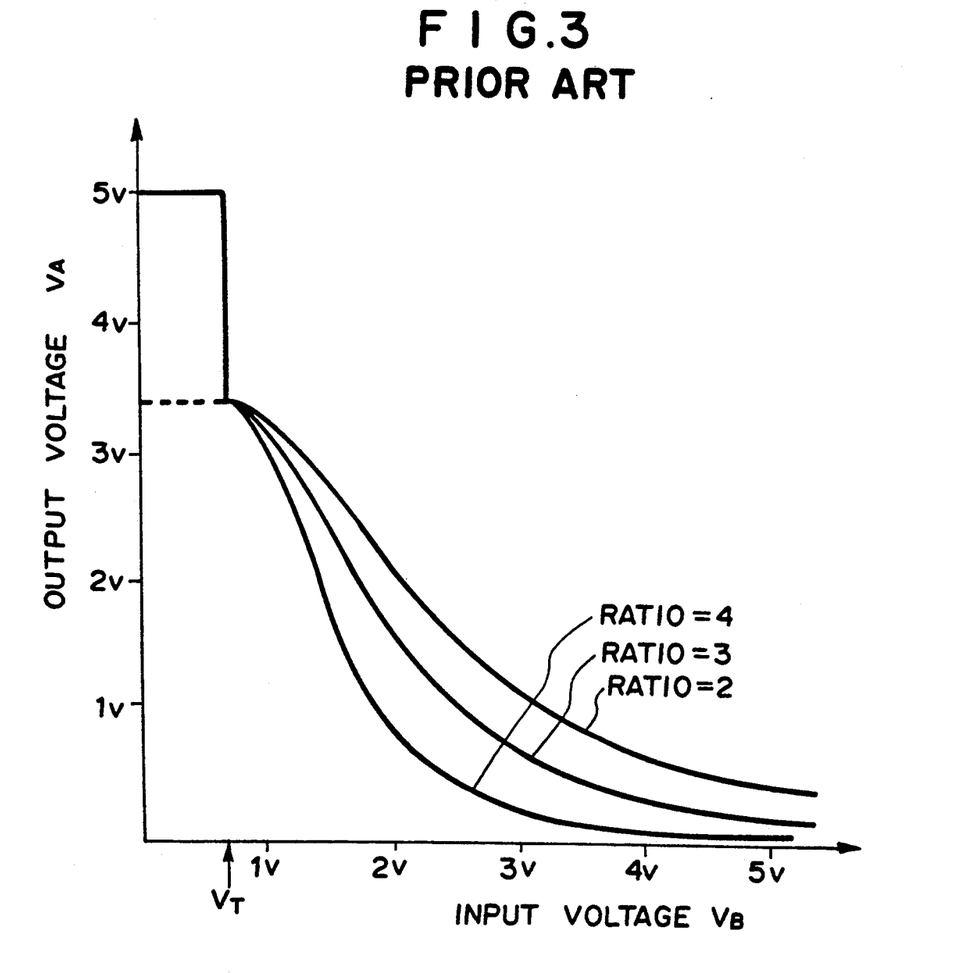
FIG. 3 is a graph showing input and output characteristics of the circuit shown in FIG. 2.

FIG. 2 is an equivalent circuit diagram showing a portion of the circuit shown in FIG. 1. A transistor Q30 in FIG. 2 corresponds to the load transistors Q5, Q6 of FIG. 1; a transistor Q20 in FIG. 2 corresponds to the transistors Q3, Q4 of FIG. 1; a transistor Q10 in FIG. 2 corresponds to the driver transistors Q1, Q2 of FIG. 1; and a resistor R in FIG. 2 corresponds to the load resistors R1, R2 of FIG. 1, respectively.

Now, in FIG. 1, if the potential of the word line W rises and reaches the $V_{CC}$ level when the node A is at the L-level and the node B is at the H-level, the level of the node A equals the level of the node A under the state in which the $V_{CC}$ is applied to the gate electrode (node B) of the transistor Q10 in FIG. 2. Here, the circuit of FIG. 2 can be considered as an inverter circuit which is constituted by the transistor Q10 used as a driver MOSFET and a parallel circuit of the two MOSFETs Q20 and Q30 connected in series and the resistor R used as a load element. Input/output characteristics of such inverter are shown in FIG. 3. FIG. 3 shows variations in the input/output characteristics when the ratios between the current supply capability of the transistor Q10 and that of the transistor Q20 (generally and simply referred to as "cell ratio") are used as parameters, and this shows that the current supply capability of the transistor Q10 is two times, three times and four times greater than that of the transistor Q20. It can be appreciated from this that the greater the cell ration is, the lower are the output voltages with respect to the same input voltage.

Thus, in order to ensure a high stability of the memory cell, it is necessary to increase the current supply ratio between the driver MOSFET and the access MOSFET so that, when the level of the word line rises, the L-level of the memory cell does not go high.

As a constant for expressing the current supply capability of the MOSFETs, the gain coefficient $\beta$ is used. This gain coefficient $\beta$ derives from the product of the process gain coefficient K determined mainly by process variations and the aspect ratio (W/L, W and L being the width and the length of the gate, respectively) of the gate of the MOSFET. This is given by:

$$\beta = K \cdot W/L.$$

Also, the cell ratio r is given by the ratio between the gain coefficient $\beta_D$ of the driver MOSFET and the gain coefficient $\beta_A$ of the access MOSFET. This is:

$$r = \beta_D/\beta_A.$$

According to the conventional technique, the means for making the cell ratio large has been to increase the aspect ratio (W/L) of the driver MOSFET and to decrease that of the access MOSFET. In other words, the gate width of the driver MOSFET is made large and the gate length thereof is made short while the gate width of the access MOSFET is made small and the gate length thereof is made long.

Thus, according to the conventional techniques referred to above, it has been the practice that (1) either the gate width of the driver MOSFET is made large or the gate length of the access MOSFET is made long and that (2) either the gate length of the driver MOSFET is made short or the gate width of the access MOSFET is made small. However, if this technique is attempted to be further advanced, the problem that the former faces is an increase in the chip size involved and the problem that the latter faces is an increase in process variations which cause the lowering of breakdown voltage and the operational instability as well as the lowering of production yields to a large extent. Thus, today, it is considered that neither the practice (1) nor the practice (2) above can help producing a desirable result if used along the line of the conventional technology.

SUMMARY OF THE INVENTION

It is, therefore, an object of the invention to overcome the problems existing in the conventional static memory device and to provide an improved memory device in which the operation stability of the memory cells is ensured.

According to one aspect of the invention, there is provided a static memory device having a plurality of memory cells each comprising a pair of driver MOSFETs whose gates and drains are cross-connected; two load elements each of which is connected between a power source and the drain of each of the driver MOSFETs; and two access MOSFETs each of which is connected between the drain of each of the driver MOSFETs and each of a pair of bit lines and whose gates are connected to a word line, the static memory device is characterized in that, a width/length aspect ratio of each gate of the driver MOSFETs is greater than that of each gate of the access MOSFETs; and a ratio between a gain coefficient of each of the driver MOSFETs and a gain coefficient of each of the access MOSFETs is greater than a ratio between the aspect ratio of each gate of the driver MOSFETs and the aspect ratio of each gate of the access MOSFETs.

For making the gain coefficient ratio between the driver MOSFETs and the access MOSFETs larger than the ratio of the width/length aspect ratios of these transistors, there are various means which include, for example, (1) a means wherein the thickness of a gate oxide film of each of the access MOSFETs is made thicker than that of each of the driver MOSFETs; (2) means wherein each of the transistors is made in an LDD (Lightly Doped Drain) configuration or a DDD (Double Diffused Drain) configuration and an impurity concentration of the low impurity concentration regions of the access MOSFETs is made lower than that of the low impurity concentration regions of the driver MOSFETs; and (3) a means wherein either or both of the source/drain regions of the access MOSFETs have an impurity concentration lower than that in the source/drain regions of the driver MOSFETs.

BRIEF DESCRIPTION OF THE DRAWINGS

The above and other objects, features and advantages of the present invention will be apparent from the following description of preferred embodiments of the invention explained with reference to the accompanying drawings, in which.

DESCRIPTION OF THE PREFERRED EMBODIMENTS

Now, some preferred embodiments of the invention will be explained with reference to the accompanying drawings. It is to be noted that, throughout the following explanation, similar reference symbols or numerals refer to the same or line elements in all the figures of the drawings.

Figure 4:
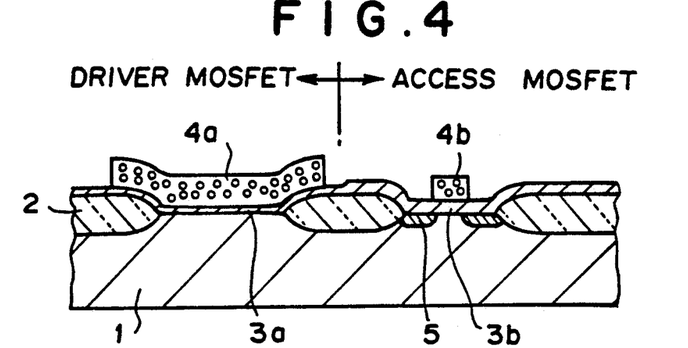
FIG. 4 is a sectional view of a structure of a first embodiment according to the invention.

FIG. 4 is a sectional view showing a cell structure of a first embodiment according to the invention. The structure shown in FIG. 4 includes a p-well 1; a field oxide film 2; a gate oxide film 3a and a gate electrode 4a of a driver MOSFET; a gate oxide film 3b and a gate electrode 4b of an access MOSFET; and an n+-type diffusion layer 5 constituting a source/drain region. As shown in FIG. 4, the thickness of the gate oxide film 3b of the access MOSFET in this embodiment is made thicker than that of the gate oxide film 3a of the driver MOSFET.

Figure 5A:
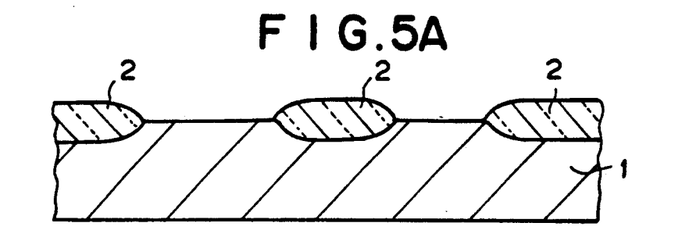
FIGS. 5A through 5D are sectional views of the structure of the first embodiment according to the invention for illustrating fabrication steps thereof.
Figure 5B:
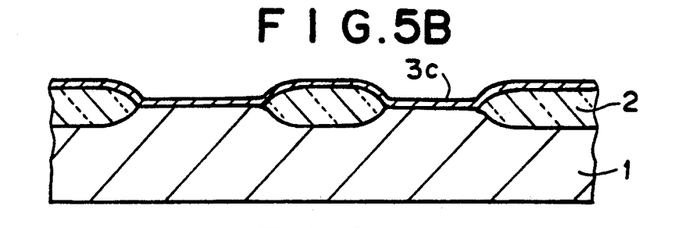

Next, a method of fabricating the cell structure of the first embodiment according to the invention is explained with reference to FIGS. 5A through 5D. First, as shown in FIG. 5A, by the ordinary methods, the necessary field oxide films 2 for device isolation are formed on the p-well 1. Thereafter, as shown in FIG. 5B, a gate oxide film precursor 3c with a thickness of 70 Å is formed on an entire surface by means of a thermal oxidation method.

Figure 5C:
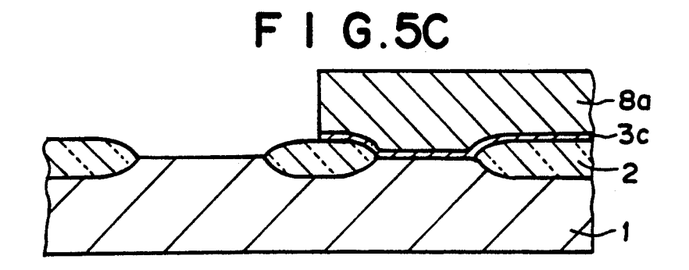

Then, as shown in FIG. 5C, a layer of photoresist 8a is applied on the gate oxide film precursor 3c, and the oxide film is etched away after the layer of photoresist at the portion of the access MOSFET is kept remained.

Figure 5D:
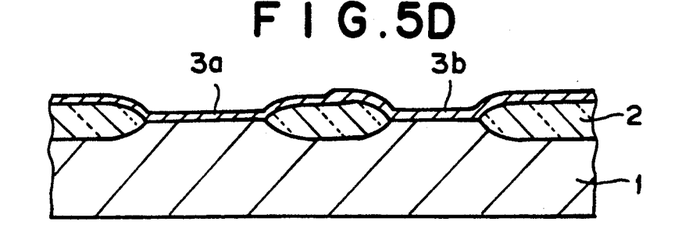

Thereafter, the photoresist 8a is removed and again the thermal oxidation is performed thereby causing an oxide film with the necessary thickness of (180 Å) of the gate oxide film of the driver MOSFET to grow and then a gate oxide film 3a is formed as shown in FIG. 5D. Consequently, the thickness of the gate oxide film 3b of the access MOSFET is the sum 250 Å of the thickness 70 Å of the gate oxide film precursor 3c and the thickness 180 Å of the gate oxide film 3a of the driver MOSFET.

Next, a film of polysilicon is deposited on the resultant surface. This film is patterned and the gate electrodes 4a, 4b are formed and, thereafter, a device as shown in FIG. 4 is formed after ion-implantation and thermal oxidation processes are conducted.

Now, the extent of improvement as to the cell ratio in the first embodiment is explained with reference to FIG. 6.

Figure 6:
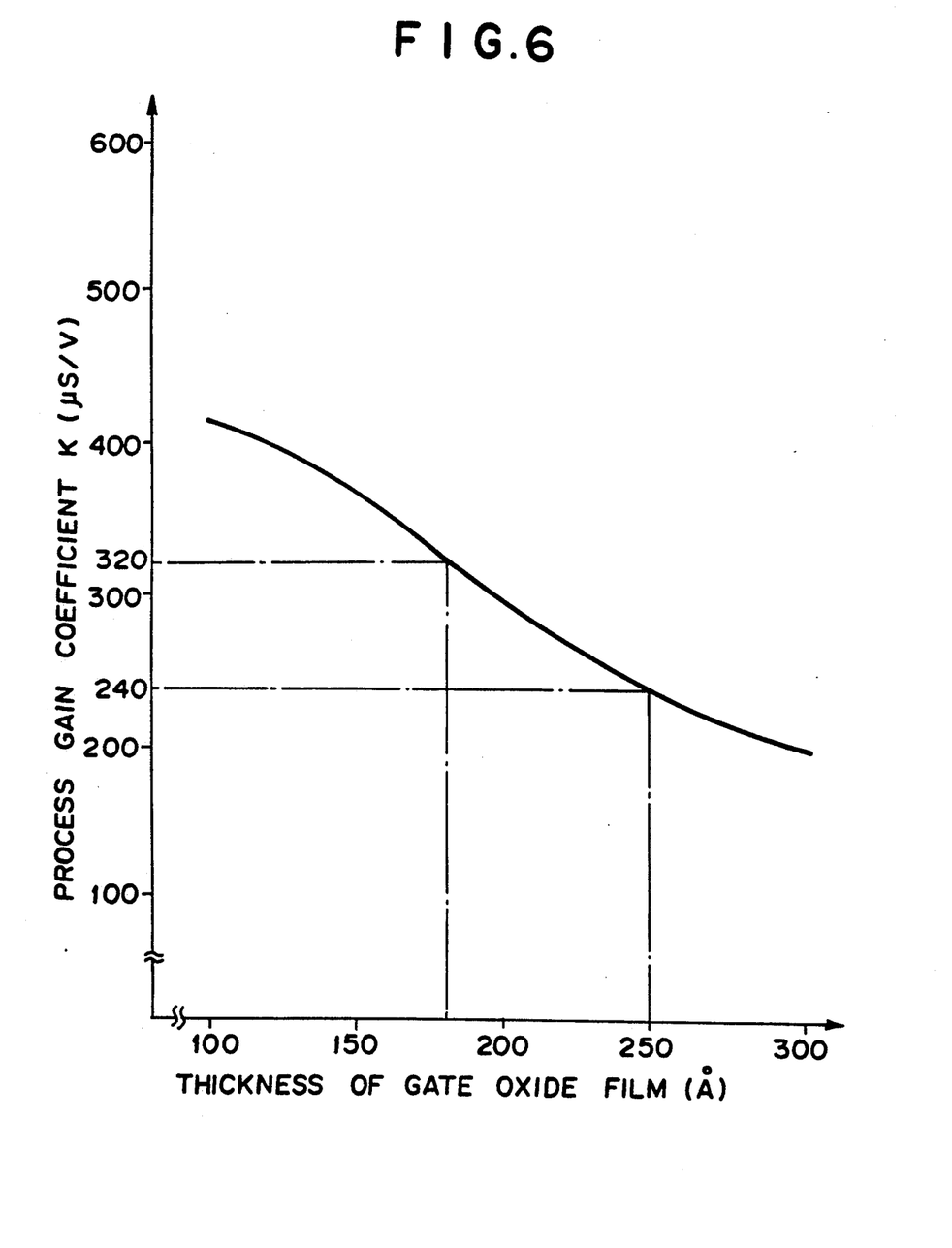
FIG. 6 is a graph showing the relation between the thicknesses of gate oxide films of MOSFETs and the process gain coefficients thereof.

FIG. 6 is a graph which shows how the process gain coefficient K as an index of the capability of the MOSFET relates to the thicknesses of the gate oxide film and in which the gate oxide film thicknesses are given in the axis of abscissas and the process gain coefficient is given in the axis of ordinates. In the first embodiment, the thickness of the gate oxide film 3a of the driver MOSFET is 180 Å and that of the gate oxide film 3b of the access MOSFET is 250 Å, so that the process gain coefficient of the driver MOSFET is approximately 320 µS (micro siemens)/V and that of the access MOSFET is approximately 240 µS/V.

The cell ratio is given by the product of the process gain coefficient ratio and the gate aspect ratio but, if the ratio of the aspect ratio of the gate electrode 4a and that of the gate electrode 4b is assumed to be 3, the cell ratio r will be:

$$r = (320/240) \times 3 = 4$$

On the other hand, since the ratio in the case where the memory is formed in the same gate size as in the first embodiment according to the conventional method is 3, it can be said that the improvement in the cell ratio in this embodiment amounts to 33%.

Figure 7:
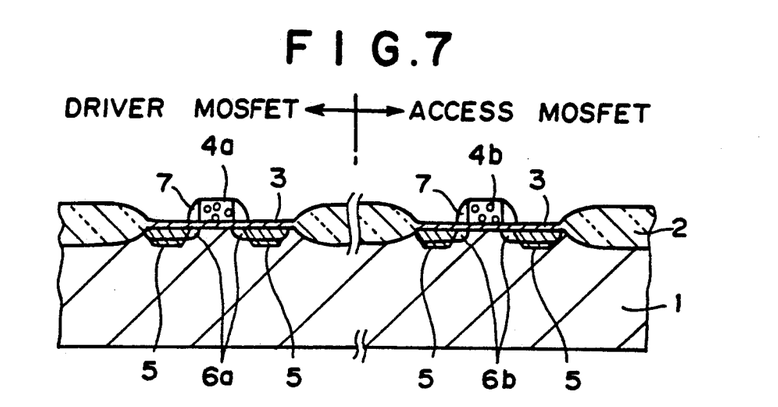
FIG. 7 is a sectional view of a structure of a second embodiment according to the invention.

FIG. 7 is a sectional view showing a structure of a second embodiment according to the present invention. The structure shown is a MOSFET of a lightly doped drain (hereinafter referred to as "LDD") structure which has been developed with the attention being paid to the fact that, as unique characteristics to the LDD structure, the current supply capability varies depending on the impurity concentration of the low impurity concentration region. In this structure, the impurity concentration of the low impurity concentration diffusion layer of the access MOSFET is made lower than the impurity concentration of the low impurity concentration diffusion layer of the driver MOSFET and in this way the ratio is made large.

The structure shown in FIG. 7 includes a p-well 1; a field oxide film 2; a gate oxide film 3; a gate electrode 4a of the driver MOSFET; a gate electrode 4b of the access MOSFET; an n+-type diffusion layer 5; and n−-type diffusion layer 6a; an n−−-type diffusion layer 6b, and a side wall 7.

Now, a method of fabricating the cell structure of the second embodiment according to the invention is explained with reference to FIGS. 8A through 8C.

Figure 8A:
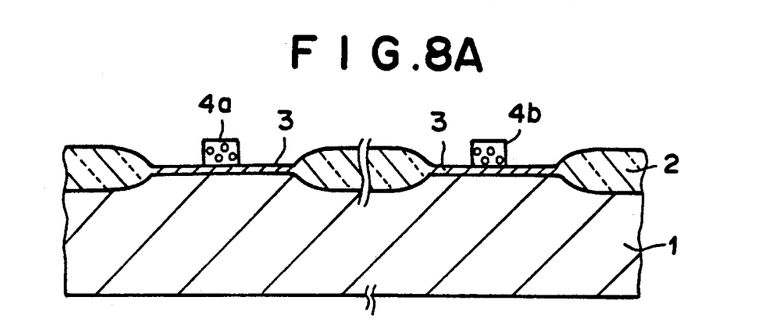
FIGS. 8A through 8C are sectional views of the structure of the second embodiment according to the invention for illustrating fabrication steps thereof.
Figure 8B:
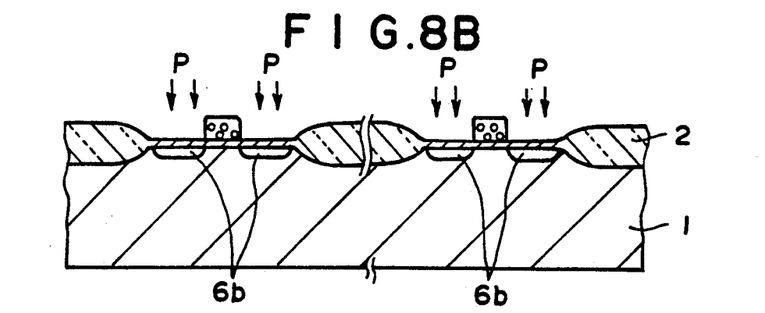
Figure 8C:
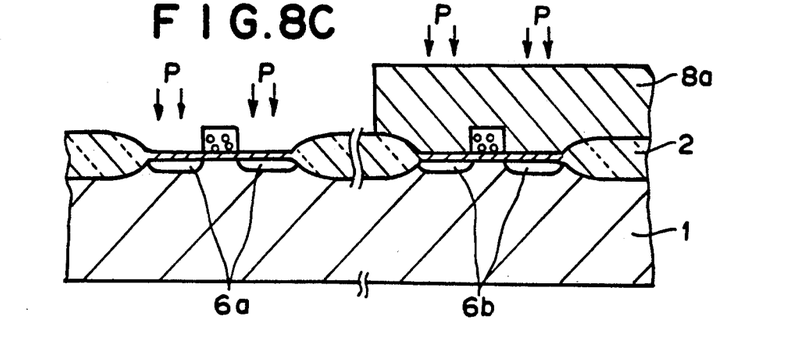

First, the fabrication up to the formation of the gate electrodes 4a and 4b follows the same procedure as in the conventional fabrication method (See FIG. 8A). Then, with the gate electrodes used as masks, the entire surface is subjected to the ion-implantation in a dose of $1 \times 10^{13}/cm^2$, so that the n−−-type diffusion layers 6b are formed and so that the impurity concentration thereof becomes that required to the low impurity concentration diffusion layer of the access MOSFET (See FIG. 8B).

Next, after a photoresist 8a is applied in such a way that the photoresist remains at a portion of the access MOSFET, the n−-type diffusion layers 6a are formed by the ion-implantation in a dose of $2 \times 10^{13}/cm^2$ so as to be in the low impurity concentration of the driver MOSFET. Thus, the dose to the n−-type diffusion layer 6a will be $3 \times 10^{13}/cm^2$.

Then, the side wall 7 is formed after the removal of the photoresist 8a and the n+-type diffusion layer 5 is formed by the ion-implantation of high impurity concentration, whereby the device as shown in FIG. 7 is obtained.

Next, the extent of improvement in the cell ratio in this second embodiment is explained with reference to FIG. 9.

Figure 9:
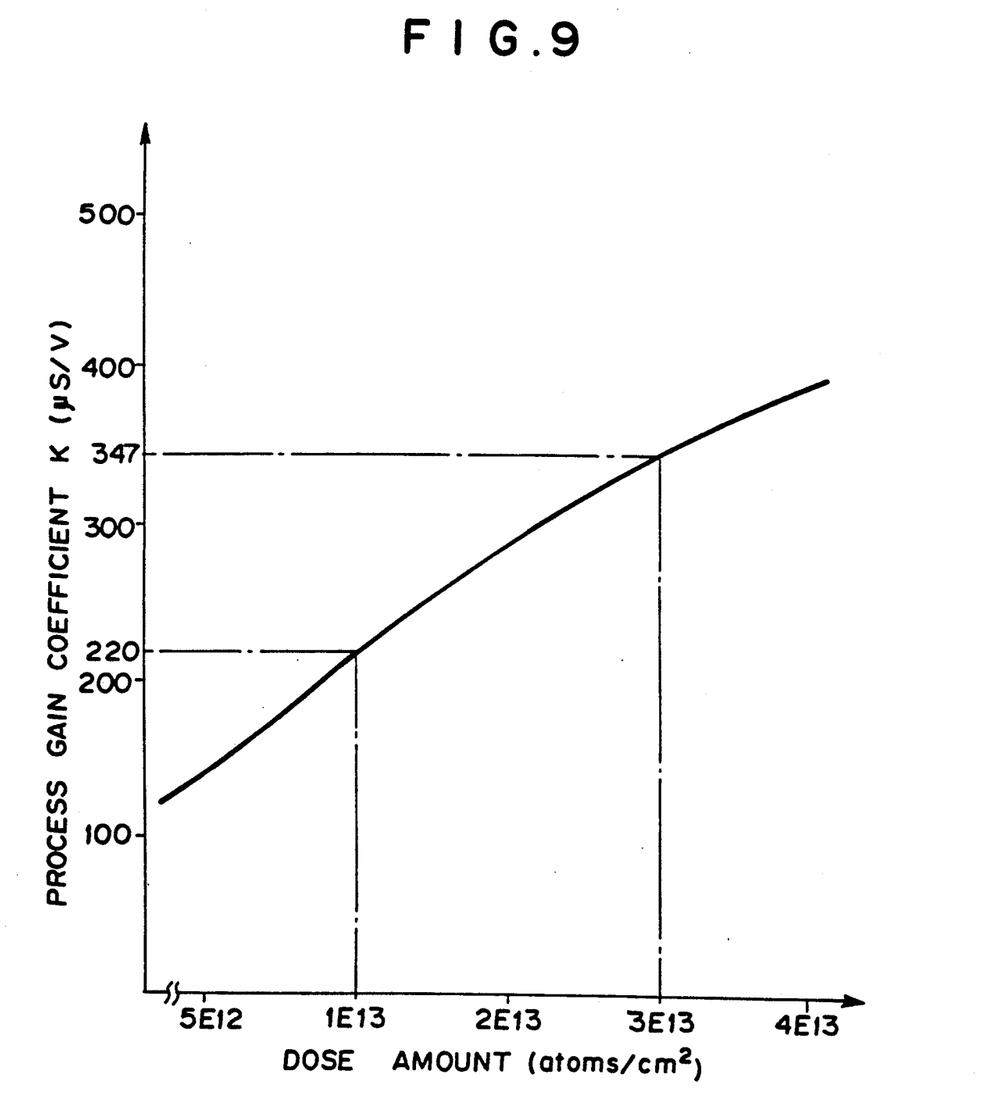
FIG. 9 is a graph showing the relation between the doses to low impurity concentration diffusion layers of MOSFETs of an LDD configuration and the process gain coefficients thereof.

FIG. 9 is a graph showing the relation which the current supply capability of the MOSFET having the LDD structure has with the impurity concentration of the low impurity concentration diffusion layer. The amount of impurity-ion-implantation into the low impurity concentration diffusion layer is given in the axis of abscissas and the process gain coefficient K is given in the axis of ordinates.

In the above second embodiment, the dose of ion-implantation to the n$^-$-type diffusion layer 6a of the driver MOSFET is $3\times10^{13}$/cm$^2$ and the dose of ion-implantation to the n$^{--}$-type diffusion layer 6b of the access MOSFET is $1\times10^{13}$/cm$^2$, so that the process gain coefficient K of the driver MOSFET will be 347 μS/V and that of the access MOSFET will be 220 μS/V.

Here, assuming that the ratio of the aspect ratios of the gate electrodes 4a and 4b is 3, the cell ratio r is:

$$r = (347/220)\times 3 = 4.7$$

This means that the improvement in the cell ratio is 57% as compared with the ratio 3 in the prior art.

Figure 10A:
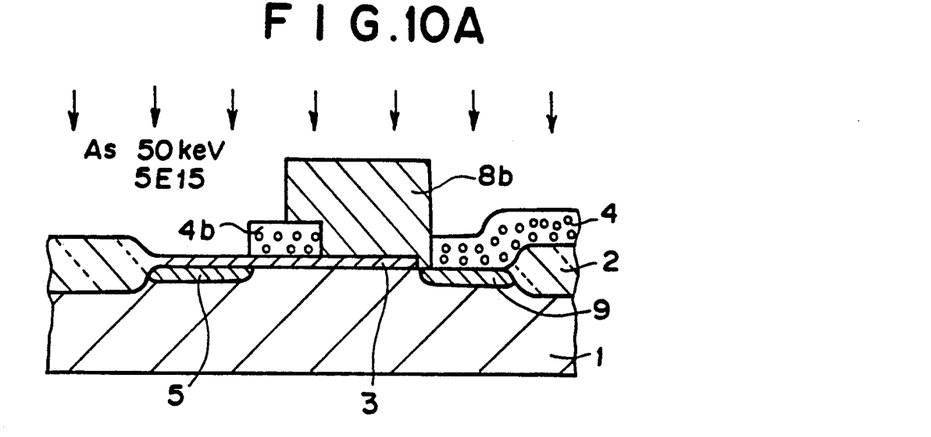
FIGS. 10A through 10C are sectional views of a structure of a third embodiment according to the invention for illustrating fabrication steps thereof.
Figure 10B:
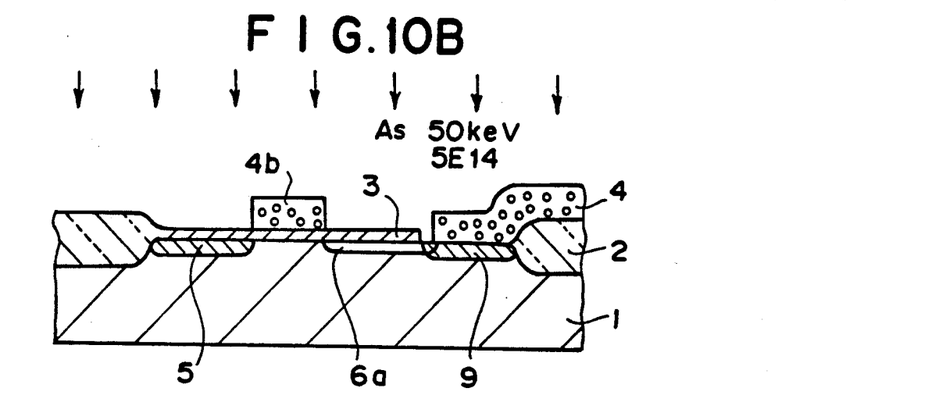
Figure 10C:
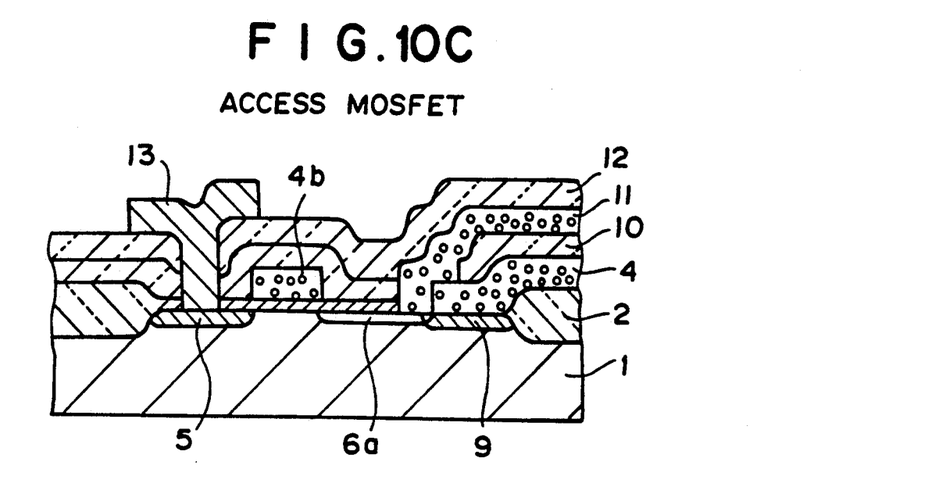

FIG. 10C shows is a sectional view showing a cell structure according to a third embodiment of the invention, and FIGS. 10A and 10B show sectional views of the structure for illustrating the fabrication steps therefor.

As shown in FIG. 10A, after the gate oxide film 3 is partly removed, polycrystalline silicon is deposited followed by the doping of impurities and the patterning, whereby there are formed the gate electrode 4b of the access MOSFET and a polycrystalline silicon interconnect 4 which is connected to the gate electrode of the driver MOSFET (not shown) and one end of which is in contact with the n-type diffusion layer 9 on the substrate.

Next, at the side of the source/drain regions of the access MOSFET, which is connected to the gate electrode of the driver MOSFET, that is, on a region of the memory node side, the photoresist 8b is formed followed by the ion-implantation of arsenic (As) at an accelerating energy of 50 keV and in a dose of $5\times10^{15}$/cm$^2$, whereby an n$^+$-type diffusion layers 5 which serve as a source/drain region at the bit line side of the access MOSFET and a source/drain region (not shown) of the driver MOSFET are formed.

Then, as shown in FIG. 10B, after the photoresist 8b is removed, the ion-implantation of As is again carried out at an accelerating energy of 50 keV and in a dose of $5\times10^{14}$/cm$^2$, whereby an n$^-$-type diffusion layer 6a is formed as a source/drain region of the access MOSFET at the memory node side.

Thereafter, an interlayer insulating film 10 is formed and, after the formation of a contact hole therein, polysilicon interconnects 11 connecting high resistance elements and memory node portions are formed, and also an interlayer insulating film 12 and an aluminum (Al) interconnect 13 constituting a bit line are formed.

In this third embodiment, assuming that the impurity concentrations of the n-type diffusion layer 9, the n$^+$-type diffusion layer 5 and the n$^-$-type diffusion layer 6a are A, B and C, respectively, their relation is B>>A≧C. Thus, the impurity concentration of the source/drain region at the memory node side of the access MOSFET is lowered thereby lowering the current supply capability of this transistor. However, what is to be noted here is that, if the impurity concentration at this region is lowered excessively, the cell ratio may become better but the resistance value becomes high causing the lowering of a speed for data writing, which means that there is a limit in the lowering of the impurity concentration.

Figure 11:
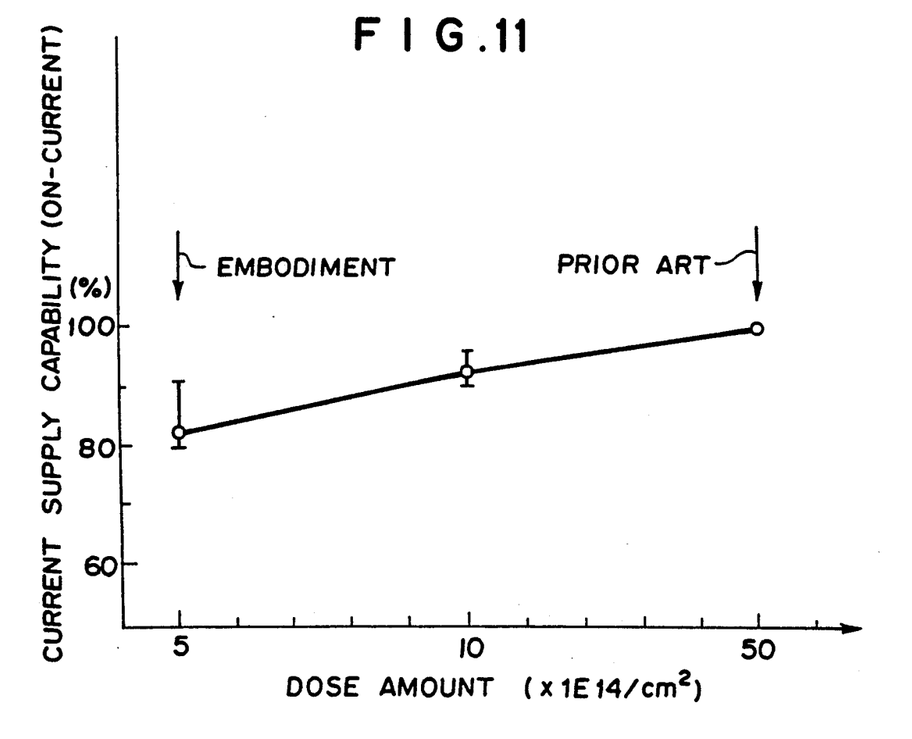
FIG. 11 is a graph showing the relation between the doses of ion-implantations and the current supplying capacities.

Now, the degree of improvement in the cell ratio in this third embodiment is explained with reference to FIG. 11. As shown in FIG. 11, when the dose of ion-implantation to one of the source/drain regions of the access MOSFET is lowered from $5\times10^{15}$/cm$^2$ to $5\times10^{14}$/cm$^2$, the current supply capability of the access MOSFET is lowered to 84%. Thus, the cell ratio results in:

$$r = 3/0.84 = 3.57$$

which means that the improvement in the cell ratio is 19% as compared with the ratio of 3 in the prior art.

Figure 12A:
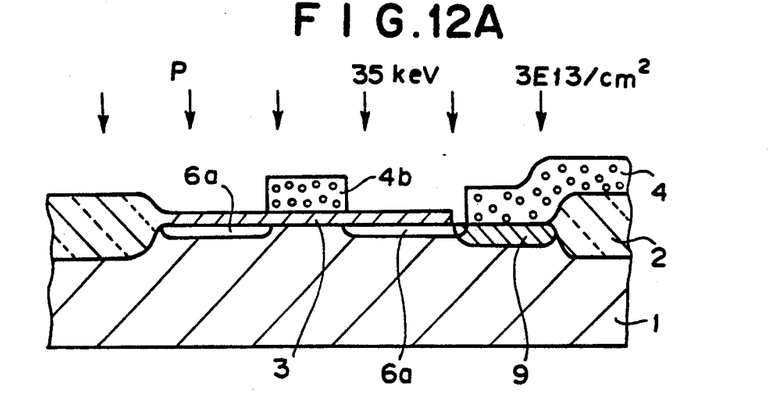
FIGS. 12A through 12C are sectional views of a structure of a fourth embodiment according to the invention for illustrating fabrication steps thereof.
Figure 12B:
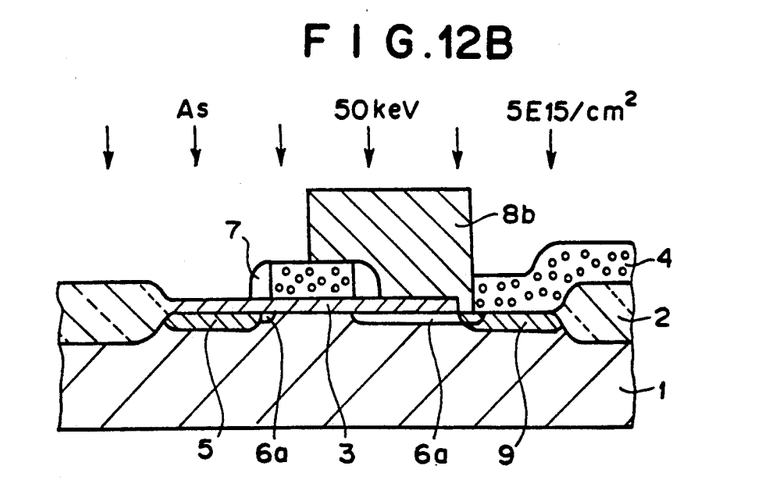
Figure 12C:
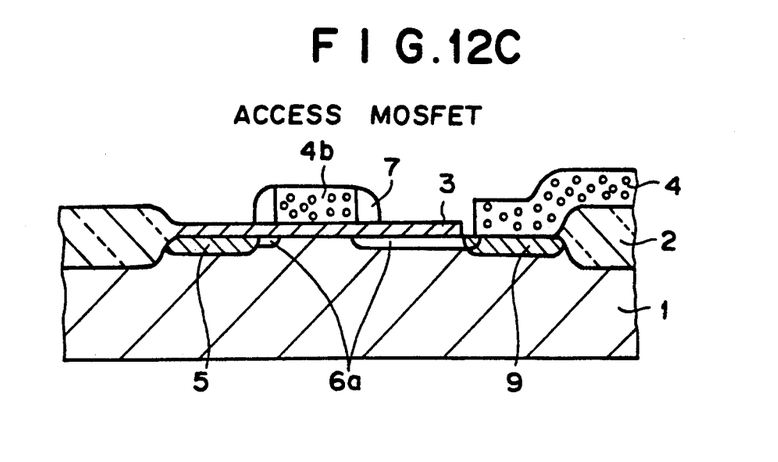

FIG. 12C is a sectional view showing a cell structure of a fourth embodiment according to the invention, and FIGS. 12A and 12B show in sectional views the structure illustrating the fabrication steps therefor. This embodiment relates to an example in which the bit line side source/drain region of the access MOSFET and the source/drain region of the driver MOSFET are formed in the LDD configuration.

As shown in FIG. 12A, a gate electrode 4b of the access MOSFET and a polycrystalline silicon interconnect 4 connected to the gate electrode of the driver MOSFET are formed and, thereafter, an n$^-$-type diffusion layer 6a is formed by the ion-implantation of phosphorus (P) at an accelerating energy of 35 keV and in a dose of $3\times10^{13}$/cm$^2$.

Next, a side wall 7 is formed on each side wall portion of the gate electrode 4b and of the gate electrode of the driver MOSFET which is not shown in the drawings, and a photoresist 8b is formed on the source/drain region at the memory node side thereof. Then, arsenic (As) is ion-implanted at an accelerating energy of 50 keV and in a dose of $5\times10^{15}$/cm$^2$, whereby an n$^+$-type diffusion layer 5 is formed as a source/drain region at the bit line side of the access MOSFET and a source/drain region of the driver MOSFET as shown in FIG. 12B. Thereafter, the photoresist 8b is removed as shown in FIG. 12C.

The steps hereafter are the same as those in the embodiments already explained.

The foregoing description has been directed to the preferred embodiments but the invention is not limited to these embodiments. For example, the first embodiment may be modified by using a nitride film for the gate insulating film of the driver MOSFET while keeping the gate insulating film of the access MOSFET as the oxide film (in which case the thicknesses of the gate insulating films of the two transistors can be made approximately the same). Also, the second embodiment may be modified by adopting a double diffusion drain structure (the so-called "DDD" structure) in place of the MOSFET of the LDD structure.

Further, it is possible to modify the third embodiment so that the source/drain region at the bit line side be formed by an n$^-$-type diffusion layer (with the memory node side being made an n$^+$-type diffusion layer), or it is possible to lower the impurity concentrations of the source/drain regions of both the bit line side and the memory node side (in which case the source/drain region at one side is formed by the region whose impurity concentration is higher that the impurity concentration of the source/drain region at the other side that is formed by the low impurity concentration region). The fourth embodiment may also be modified so as to make the impurity concentration of the n$^-$-type diffusion layer of the LDD structure at the bit line side different from that of the n⁻-type diffusion layer serving as the source/drain region at the memory node side.

Here, the consideration is given as to the influence that the above modification to the fourth embodiment has with respect to hot-carrier degradation or suppressing effects. Generally, where the LDD configuration is adopted to cope with hot carriers in the MOSFET, the diffusion layers having the same concentration are provided respectively at both the sides of the source/drain region with the impurity concentration of the n⁻-type diffusion layer being an optimum concentration determined by the device dimensions. However, in the above modification, the impurity concentration of the n⁻-type diffusion layer at the bit line side is determined with a view to cope with hot carriers as mentioned above, and the impurity concentration of the source/drain region at the memory node side is determined by taking into account the operation stability and the operation speeds of the memory cell.

First, at the read-out mode, both the bit lines are caused to be H-level, so that the bit line sides become drains in both the access MOSFETs. In this case, since the drains are in the LDD configuration, the structure may be considered the same as that of the prior art in consideration of the hot carriers. Next, at the write mode, where the memory node is at the L-level and the bit line is at the H-level, the bit line sides become drains so that the same applies here as in the above read-out mode and, where the memory node sides become drains on the contrary, the current which flows to the access MOSFET is the charge accumulated in the capacitance at the memory node side, so that hot carriers have almost no effect. Therefore, even where the above modification is applied to a miniaturized or scaled-down structure, the impurity concentration of the source/drain at the memory node side can be determined irrespective of the concentration normally taken into account for coping with hot carriers.

As explained above, according to the invention, the cell ratio of the memory cell is made greater than the ratio of the aspect ratios of the driver MOSFET and the access MOSFET and, as a result, it has been made possible to enhance the stability of the memory cell without the need of increasing the chip size and without sacrificing the fabrication and operational tolerances.

Further, according to the invention, it is to be noted that, not only in the second to fourth embodiments but also in the first embodiment as well, the threshold voltage $V_T$ of the access MOSFET is virtually without change from that in the conventional structure. This has a significant bearing on the operational stability from another aspect. In order to lower the current supply capability of the access MOSFET, it can be attempted to perform, for example, the channel doping but, in such a case, the threshold voltage $V_T$ becomes high to a large extent. Thus, the H-level of the memory cell immediately after the writing is lowered so that, if the read-out takes place without the lapse of a sufficient time after the writing, there is a risk of the data inversion of the memory cell. According to the present invention, however, since the current supply capability is lowered with the threshold value remaining almost the same as that in the prior art, the problem such as the inversion of the memory cell does not occur.

In recent years, the density of semiconductor memories and the capacity thereof are steadily increasing and, for the enhancement thereof, there is a need of a further advanced technology for the fabrication of miniaturized structures. Recently, in view of limits in the optical lithography, the trend is seen that the process precision cannot be expected to be advanced as largely as heretofore. Thus, there is an increasing need in the technology to achieve the asymmetric character of static memory cells which inherently require a very strict symmetric character and, along with this, the improvement of the "cell ratio" which can ensure the stability of memory cells is becoming very important. The present invention has been made in order to meet the demand and need brought about as above and this is considered to contribute greatly to the advancement of the technology in the related industry.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A static memory device having a plurality of memory cells each comprising a pair of driver MOSFETs whose gates and drains are cross-connected;

two load elements one of which is connected between a power source and the drain of one of said driver MOSFETs and the other of which is connected between a power source and the drain of the other of said driver MOSFETs; and two access MOSFETs one of which is connected between the drain of one of said driver MOSFETs and one of a pair of bit lines and the other of which is connected between the drain of the other of said driver MOSFETs and the other of said pair of bit lines and whose gates are connected to a word line, said driver and access MOSFETs being arranged such that a width/length aspect ratio of each gate of said driver MOSFETs is greater than that of each gate of said access MOSFETs, and that a ratio between a gain coefficient of each of said driver MOSFETs and a gain coefficient of each of said access MOSFETs is greater than a ratio between the aspect ratio of each gate of said driver MOSFETs and the aspect ratio of each gate of said access MOSFETs.

2. A static memory device having a plurality of memory cells each comprising a pair of driver MOSFETs whose gates and drains are cross-connected;

two load elements one of which is connected between a power source and the drain of one of said driver MOSFETs and the other of which is connected between a power source and the drain of the other of said driver MOSFETs; and two access MOSFETs one of which is connected between the drain of one of said driver MOSFETs and one of a pair of bit lines and the other of which is connected between the drain of the other of said driver MOSFETs and the other of said pair of bit lines and whose gates are connected to a word line, said driver and access MOSFETs being arranged such that a width/length aspect ratio of each gate of said driver MOSFETs is greater than that of each gate of said access MOSFETs, and that a ratio between a gain coefficient of each of said driver MOSFETs and a gain coefficient of each of said access MOSFETs is greater than a ratio between the aspect ratio of each gate of said driver MOSFETs and the aspect ratio of each gate of said access MOSFETs and wherein said driver MOSFETs each has a gate insulating film whose thickness is thinner than a gate insulating film of each of said access MOSFETs.

3. A static memory device having a plurality of memory cells each comprising a pair of driver MOSFETs whose gates and drains are cross-connected;

two load elements one of which is connected between a power source and the drain of one of said driver MOSFETs and the other of which is connected between a power source and the drain of the other of said driver MOSFETs; and two access MOSFETs one of which is connected between the drain of one of said driver MOSFETs and one of a pair of bit lines and the other of which is connected between the drain of the other of said driver MOSFETs and the other of said pair of bit lines and whose gates are connected to a word line, said driver and access MOSFETs being arranged such that a width/length aspect ratio of each gate of said driver MOSFETs is greater than that of each gate of said access MOSFETs, and that a ratio between a gain coefficient of each of said driver MOSFETs and a gain coefficient of each of said access MOSFETs is greater than a ratio between the aspect ratio of each gate of said driver MOSFETs and the aspect ratio of each gate of said access MOSFETs and wherein said driver MOSFETs and said access MOSFETs are arranged such that, at their source/drain regions, there are formed low impurity concentration regions at corresponding locations and that an impurity concentration of said low impurity concentration regions of said driver MOSFETs is higher than that of said low impurity concentration regions of said access MOSFETs.

4. A static memory device having a plurality of memory cells each comprising a pair of driver MOSFETs whose gates and drains are cross-connected;

two load elements one of which is connected between a power source and the drain of one of said driver MOSFETs and the other of which is connected between a power source and the drain of the other of said driver MOSFETs; and two access MOSFETs one of which is connected between the drain of one of said driver MOSFETs and one of a pair of bit lines and the other of which is connected between the drain of the other of said driver MOSFETs and the other of said pair of bit lines and whose gates are connected to a word line, said driver and access MOSFETs being arranged such that a width/length aspect ratio of each gate of said driver MOSFETs is greater than that of each gate of said access MOSFETs, and that a ratio between a gain coefficient of each of said driver MOSFETs and a gain coefficient of each of said access MOSFETs is greater than a ratio between the aspect ratio of each gate of said driver MOSFETs and the aspect ratio of each gate of said access MOSFETs and wherein said driver MOSFETs and said access MOSFETs are arranged such that, at their source/drain regions, there are formed low impurity concentration regions at corresponding locations and that an impurity concentration of said low impurity concentration regions of said driver MOSFETs is higher than that of said low impurity concentration regions of said access MOSFETs and that at least one selected from the group consisting of said source region and said drain region of said access MOSFETs have an impurity concentration lower than that in said source/drain regions of said driver MOSFETs.

* * * * *